United States Patent
Ohannaidh (10) Patent No.: US 7,375,583 B2
(45) Date of Patent: May 20, 2008

(54) LOW NOISE LOWPASS FILTER

(75) Inventor: Eoin Ohannaidh, Laval (FR)

(73) Assignee: STMicroelectronics S.A., Montrouge (FR)

( * ) Notice: Subject to any disclaimer, the term of this patent is extended or adjusted under 35 U.S.C. 154(b) by 31 days.

(21) Appl. No.: 11/343,937

(22) Filed: Jan. 31, 2006

(65) Prior Publication Data

US 2006/0186951 A1    Aug. 24, 2006

(30) Foreign Application Priority Data

Feb. 2, 2005    (EP)    ................................. 05290233

(51) Int. Cl.
*H03K 5/00* (2006.01)
(52) U.S. Cl. ...................... 327/558; 327/552
(58) Field of Classification Search ......... 327/551–559
See application file for complete search history.

(56) References Cited

U.S. PATENT DOCUMENTS

| 4,524,332 | A |   | 6/1985 | Gay ............................ 330/294 |
| 4,877,979 | A | * | 10/1989 | Sempel ........................ 327/555 |
| 5,227,681 | A | * | 7/1993 | Koyama et al. ............... 327/65 |
| 5,489,872 | A | * | 2/1996 | Gopinathan .................. 327/552 |
| 6,011,431 | A | * | 1/2000 | Gilbert ........................ 327/553 |
| 6,335,655 | B1 | * | 1/2002 | Yamamoto ................... 327/552 |

FOREIGN PATENT DOCUMENTS

EP    0 274 784 A1    7/1988

* cited by examiner

*Primary Examiner*—Dinh T. Le
(74) *Attorney, Agent, or Firm*—Lisa K. Jorgenson; Robert Iannucci; Seed IP Law Group PLLC (57) ABSTRACT

A differential biquad filter includes positive and negative single ended circuits connected between first and second power supply terminals. Each single ended circuit includes a single input terminal; a transistor having a control terminal, and first and second main terminals; a single output terminal corresponding to the control terminal of the transistor; first and second conductances connected between the single input terminal and the control terminal of the transistor; a first capacitance connected between the control terminal of the transistor and the second main terminal of the other single ended circuit; and a second capacitance connected between the node between the first and second conductances on one hand and the second main terminal of the transistor on the other hand. The differential biquad filter also includes a fifth capacitance connected between the second main terminals of each transistor of each single ended circuit.

19 Claims, 3 Drawing Sheets

LOW NOISE LOWPASS FILTER

BACKGROUND OF THE INVENTION

1. Field of the Invention

The present invention relates generally to electrical filters and in particular to lowpass biquad filters.

2. Description of the Related Art

A lowpass filter is a filter for attenuating or damping the frequency band beyond a given frequency, also called the filter cutoff. Thus the amplitude response of a lowpass filter is different for frequencies either above or below the filter cutoff.

Lowpass filters, such as Butterworth, Chebychev or Bessel filters, have been used for years in the signal processing of signals in a reverberant or high clutter background. These high order filters present poles only and generally consist of several biquad filters, or biquads. A biquad filter is generally a filter with a two pole and two zero filter topology, i.e., with a second order transfer function in the s-domain both in the numerator or denominator. The poles and zeroes are directly linked to the elimination capacities of the biquad filter. Other types of biquad filters, as will be described later on, can include only poles, with a denominator of a biquadratic form.

Commonly used implementations of lowpass filters require a lot of operational amplifiers (OP-Amp) and other components, resulting in complex circuit architectures, high current consumptions and low noise performances. Noise specifications as low as −130 dBc/Hz, as required for example in GSM applications, are difficult to achieve. This is largely due to the contribution of the current sources and sinks generally implemented in the lowpass filters.

For low noise applications, a high order filter uses biquads with high Q factors. The Q factor of a biquad is related to the tangent of the biquad pole position ($\tan \theta$) by the equation: $\tan \theta = \sqrt{4Q^2 - 1}$. Q factor and $\tan \theta$ are two ways of indicating the pole positions of a biquad filter, the higher their value is, the harder the circuit is to design, as explained here after.

A 2Nth order lowpass filter (N being a non-nil integer), for example a Butterworth filter, is made of 2N poles. All 2N poles have the same magnitude, but present different angles $\theta$, and thus different values of $\tan \theta$. However the 2N poles are actually made up of N pole-pairs, known as complex conjugate pairs. The purpose of the biquad filter is to provide a single pole-pair (thus two poles). Thus, to build a 2Nth order Butterworth filter, N cascading biquad filters are needed, each providing two poles, or a complex conjugate pole-pair.

For instance, a 2nd order lowpass Butterworth filter with a cutoff frequency |P|, one biquad filter is used to provide a pole-pair of magnitude |P| and $\tan \theta = 1$. A 4th order lowpass Butterworth filter with cutoff frequency |P| will require 2 biquad filters in series, one to provide a pole-pair of magnitude |P| and $\tan \theta = 0.414$ and a second to provide a pole-pair of magnitude |P| and $\tan \theta = 2.414$. A 6th order low-pass Butterworth filter with cutoff frequency |P| will use three biquad filters in series, one to provide a pole-pair of magnitude |P| and $\tan \theta = 0.268$, a second to provide a pole-pair of magnitude |P| and $\tan \theta = 1$, and a third to provide a pole-pair of magnitude |P| and $\tan \theta = 3.732$.

As the order of the filter increases, more biquad filters are used, and the $\tan \theta$ (or Q) values of the last biquad filter gets higher. This large value of $\tan \theta$ can be problematic, as the ratio of component values is often related to $\tan^2 \theta$.

BRIEF SUMMARY OF THE INVENTION

One embodiment of the present invention improves the noise performances thanks to a lowpass filter that can achieve high $\tan \theta$ values, and yet maintain low component ratios.

This is achieved according to a first embodiment of the present invention thanks to a differential biquad filter which has a simple layout, namely with few transistors, and therefore exhibits less current consumption.

A second embodiment of the present invention relates to a lowpass filter using a plurality of differential biquad filters all connected in cascade and powered by the same voltage supply.

As a way to further improve the noise performance of a filter beyond a certain point is to place identical structures in parallel with regard to the input signal. A given number of N structures in parallel will produce $\sqrt{N}$ times less noise relative to the input signal. Said structures are connected in parallel between the power supply terminals will therefore consume N times more current, it is important that the elementary differential biquad filter structure consumes as little current as possible.

The circuit architecture of the proposed differential biquad filter is based on a well known Sallen-Key biquad circuit, the follower current of which is added to a second current, also derived from the Sallen-Key circuit, to realize the biquad filter transfer function.

BRIEF DESCRIPTION OF THE SEVERAL VIEWS OF THE DRAWINGS

The features of the present invention will become more apparent from the consideration of the following detailed description of an exemplary embodiment taken in conjunction with the accompanying drawings, in which.

On the different figures, the same elements carry the same reference numbers.

DETAILED DESCRIPTION OF THE INVENTION

Figure 1:
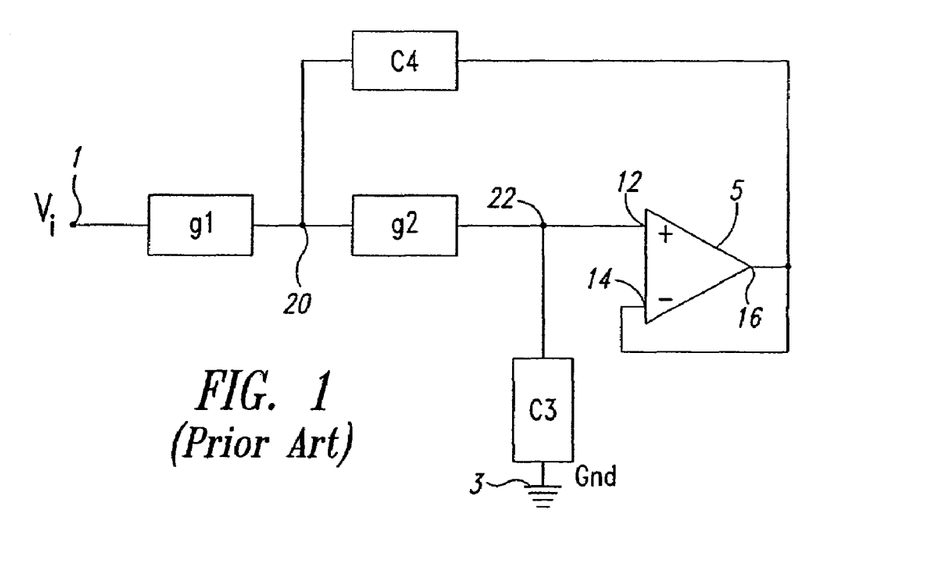
FIG. 1 is a schematic circuit diagram of a conventional Sallen-Key filter circuit.

FIG. 1 illustrates a typical Sallen-Key filter circuit. The circuit comprises an operational amplifier 5 connected in unity gain. It has positive and negative input terminals 12,14 and an output terminal 16 connected to the negative input 14. First and second conductances g1 and g2 are connected between an input 1 of the circuit and the positive input terminal 12 of the amplifier 10. A first capacitance C3 is connected between one terminal 22 of the second conductance g2 and the ground 3, or any AC ground node for that matter. A second capacitance C4 is connected between a junction 20 between the two first conductances and the output terminal 16 of the amplifier. Naming V22 the output signal on node 22 of FIG. 1 and Vi the input signal on node 1, the Sallen-Key filter circuit yields the following relationship (1.1):

$$\frac{V_{22}}{V_i} = \frac{g_1 g_2}{g_1 g_2 + sC_3(g_1 + g_2) + s^2 C_3 C_4} \quad (1.1)$$

using the classic complex variable approach with Y=g+sC, where Y is any admittance, g is a conductance, C is a capacitance, and s=jω with ω as the frequency.

The input admittance is given by following equation (1.2):

The advantage of the Sallen-Key architecture is its simplicity. Nevertheless, using Sallen-Key circuits in a lowpass filter leads to the ratio $$\frac{C_3}{C_4} = 1 + \tan^2\theta,$$

so if tan θ=3.732 as seen before, this requires that $$\frac{C_3}{C_4} = 15,$$

which is too strong a constraint on the circuit design.

Figure 2:
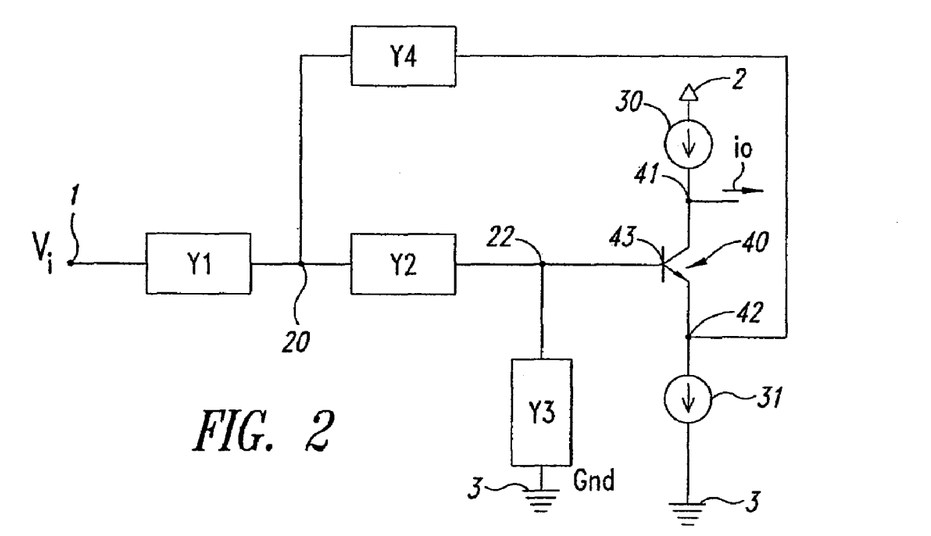
FIG. 2 is a schematic circuit diagram of a modified Sallen-Key filter circuit.

The op-amp in unity gain arrangement can be replaced by a follower transistor, as shown in FIG. 2. In this figure, the op-amp 5 of FIG. 1 is replaced by a follower transistor 40 between the capacitance C4 and node 22. The follower transistor comprises two main terminals 41 and 42 and one control terminal 43. Capacitance C4 is connected to the second main terminal 42 of the follower transistor. Two current sources 30 and 31 have been added. The first one 30 is connected between a first power supply terminal 2 and the first main terminal 41 of the follower transistor, while the second one 31 is connected between the second main terminal 42 of the follower transistor and a second power supply terminal, here the ground 3. Both current sources could deliver the same current, though they could also be used to correct direct current (DC) offsets at the biquad output.

The follower transistor itself can be a bipolar transistor, either of the NPN or PNP type. It could also be a MOS transistor. In the examples shown hereafter, the follower transistor 40 is an NPN transistor. Thus the control terminal 43 of the NPN transistor is the base, its first main terminal 41 is the collector and its second main terminal 42 is the emitter. The first power supply terminal delivers a positive DC voltage Vdd, and the second power supply terminal is ground.

If a PNP transistor is chosen, the base, the collector and the emitter of the transistor correspond to the same terminals as for an NPN transistor, while the first power supply terminal is ground, and the second power supply terminal delivers a positive DC voltage Vdd. If a MOS transistor is chosen, the control terminal 43 of the MOS transistor is the gate, its first main terminal 41 is the drain and its second main terminal 42 is the source. The first power supply terminal of an NMOS transistor delivers a positive DC voltage Vdd, and the second power supply terminal is ground. The first power supply terminal of a PMOS transistor is ground, and the second power supply terminal delivers a positive DC voltage Vdd. The man skilled in the art can easily adapt the hereafter examples to alternative circuits using either a PNP transistor, an NMOS or a PMOS transistor.

Transistor 40 is acting as a follower, with the input of the follower connected at the control terminal 43 and the output of the follower connected at the second main terminal 42.

However, the disadvantage of this architecture is that large component ratios are required. If $$Rc = \frac{C_4}{C_3} \text{ and } Rg = \frac{g_2}{g_1},$$

it can be shown that:

$$Rc = \frac{(Rg + 1)^2 (1 + \tan^2\theta)}{4Rg} \quad (2)$$

which has a minimum of Rc=1+tan²θ at Rg=1.

From relation (2), it can be appreciated that this architecture is not suitable for generating complex pole pairs with high tan θ values. The general architecture of the differential biquad filter according to one embodiment of the present invention is presented on FIG. 3. The architecture is similar to the modified Sallen-Key circuit shown in FIG. 2, and is completed as follows.

Figure 3:
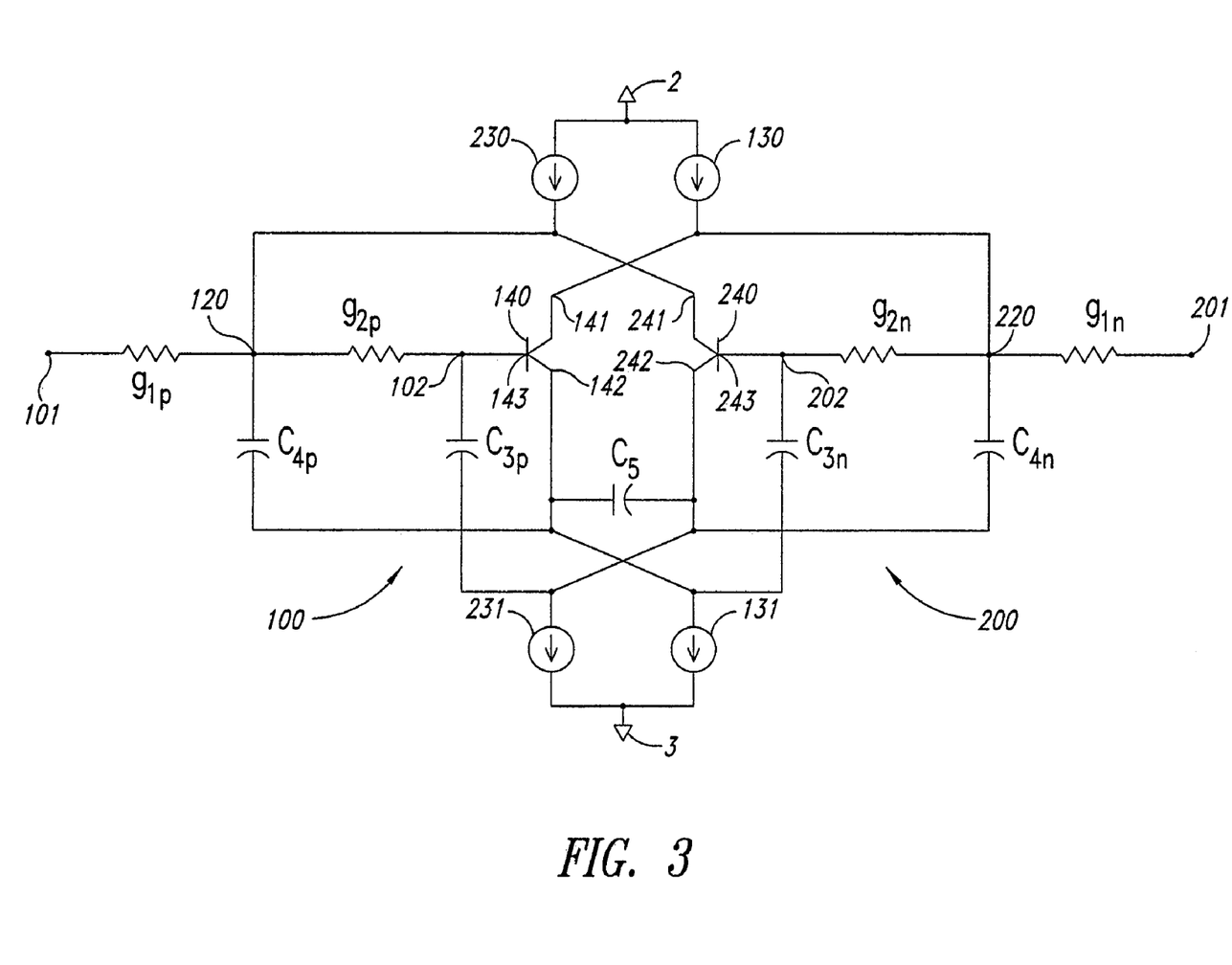
FIG. 3 is a structural circuit diagram of an exemplary differential biquad filter according to one aspect of the present invention.

It further comprises positive and negative single ended circuits 100, 200. Both single ended circuits are symmetrical and will be described hereafter. Each single ended circuit is arranged between first and second power supply terminals 2, 3, in this case for example the first power supply terminal 2 delivers a positive DC voltage Vdd, and the second power supply terminal 3 is ground.

The first single ended circuit 100, hereafter called the positive single ended circuit, further comprises a single input terminal 101 and a single output terminal 102. A transistor 140 is also provided, having a control terminal 143, and first main terminal 141 and a second main terminal 142. The single output terminal 102 corresponds to the control terminal 143 of the transistor 140. First and second conductances, g1p and g2p are connected between the single input terminal 101 and the control terminal 143 of the transistor 140. A first current source 130 is connected between the first power supply terminal 2 and the first main terminal 141 of the transistor 140 while a second current source 131 is connected between the second main terminal 142 of the transistor 140 and the second power supply terminal 3. A first capacitance C3p is connected between the control terminal 143 of the transistor 140 and the second main terminal 242 of the transistor 240 of the negative single ended circuit. A second capacitance C4p connected between the node 120 between the first and second conductances g1p and g2p on one hand, and the second main terminal 142 of the transistor 140 on the other hand. The first main terminal 141 is further connected to the node 220 between the first and second conductances g1n and g2n of the negative single ended circuit.

As the single ended circuits are symmetrical, the second single ended circuit 200, hereafter called the negative single ended circuit, comprises a single input terminal 201 and a single output terminal 202. A transistor 240 is also provided, having a control terminal 243, and first main terminal 241 and a second main terminal 242. The single output terminal 202 corresponds to the control terminal 243 of the transistor 240. First and second conductances, g1*n* and g2*n* are connected in series between the single input terminal 201 and the control terminal 243 of the transistor 240. A first current source 230 is connected between the first power supply terminal 2 and the first main terminal 241 of the transistor 240 while a second current source 231 is connected between the second main terminal 242 of the transistor 240 and the second power supply terminal 3. A first capacitance C3*n* is connected between the control terminal 243 of the transistor 240 and the second main terminal 142 of the transistor 140 of the positive single ended circuit. A second capacitance C4*n* connected between the node 220 between the first and second conductances g1*n* and g2*n* on one hand, and the second main terminal 242 of the transistor 240 on the other hand. The first main terminal 241 is further connected to the node 120 between the first and second conductances g1*p* and g2*n* of the negative single ended circuit.

Both single ended circuits are connected to the same first and second power supply terminals, here Vdd and the ground. The differential biquad filter comprising the two single ended circuits further comprises a fifth capacitance C5 connected between the second main terminals 142 and 242 of each transistor 140 and 240 respectively. The terminals 101 and 102 of the positive single ended circuit 100 can also be called respectively the positive input and output terminals. The terminals 201 and 202 of the negative single ended circuit 200 can also be called respectively the negative input and output terminals If Vip and Vin are respectively the potentials of the input terminals 101 and 201 of the single ended circuits, and Vop and Von respectively the potentials of the output terminals 102 and 202, the frequency response of the differential circuit of FIG. 3 is:

$$\frac{Vop - Von}{Vip - Vin} = \frac{g_1 g_2}{g_1 g_2 + 2s(g_1 C_3 - g_2 C_5) + 4s^2 C_3 C_4} \quad (3.1)$$

with an input impedance given by:

$$Y_i = \frac{2g_1(2s^2 C_3 C_4 - g_2 s C_5)}{g_1 g_2 + 2s(g_1 C_3 - g_2 C_5) + 4s^2 C_3 C_4} \quad (3.2)$$

where g1*n*=g1*p*=g1; g2*n*=g2*p*=g2; C3*n*=C3*p*=C3; and C4*n*=C4*p*=C4, as the differential singled ended circuits are symmetrical.

The impedance Yi converges to g1 at high frequencies. If $$Rc = \frac{C4}{C3}, \quad Rt = \frac{C5}{C3} \text{ and } Rg = \frac{g2}{g1},$$

it can be shown that:

$$Rc = \frac{(RgRt - 1)^2 (1 + \tan^2 \theta)}{4Rg} \quad (4)$$

or alternatively:

$$Rg = \frac{2Rc + Rt(1 + \tan^2 \theta) - 2\sqrt{Rc^2 + RcRt(1 + \tan^2 \theta)}}{Rt^2(1 + \tan^2 \theta)} \text{ for } Rt \neq 0 \quad (5)$$

$$Rg = \frac{1 + \tan^2 \theta}{4Rc} \text{ for } Rt = 0 \quad (6)$$

Assuming that |P| is the pole of the differential biquad filter, and given that $$|P|^2 = \frac{g_1 g_2}{4 C_3 C_4},$$

one obtains a second equation to calculate the component values:

$$\frac{g_1}{C_3} = 2|P| \sqrt{\frac{Rc}{Rg}} \quad (7)$$

Thus the component values can be found by choosing g1, Rg and Rt, using equation (7) to find C3, and then using Rc of equation (4) to find C4. Alternatively, the component values can be found by choosing C3, Rc and Rt, using equation (7) to find g1 then using Rg of either equation (5) or (6) to find g2.

Figure 5:
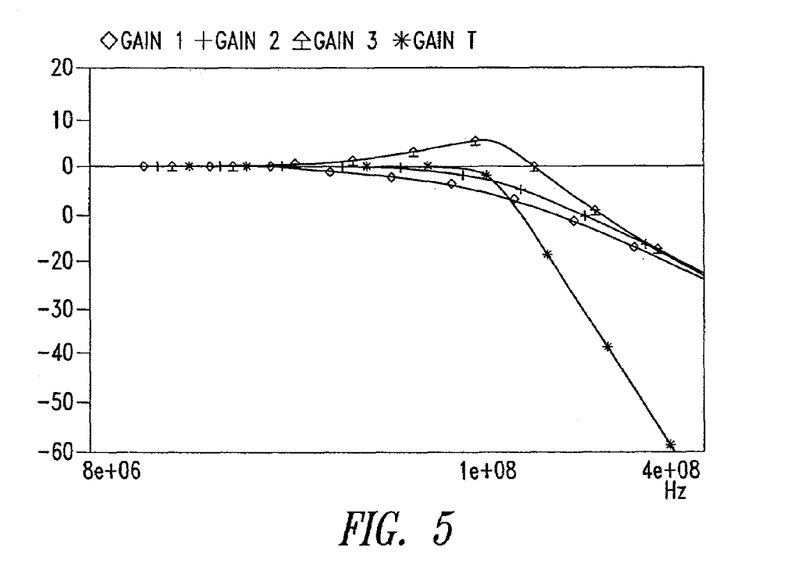
FIG. 5 is a diagram showing the frequency response of an application of the lowpass filter made of 3 differential biquads according to FIG. 4.

The differential circuit of FIG. 5 uses two NPN transistors, but can alternatively be replaced by two PNP transistors, by inverting the two first and second power supply terminals 2 and 3. NMOS or PMOS transistors could also be used. The man skilled in the art can easily adapt the here before architecture to alternative circuits using either PNP transistors, NMOS or PMOS transistors.

Therefore, in an embodiment of the invention, the transistor of the positive single ended circuit and the transistor of the negative single ended circuit are identical bipolar transistor, either of the NPN or of the PNP type.

In another embodiment of the present invention, the transistor of the positive single ended circuit and the transistor and the negative single ended circuit are identical MOS transistor, either of the NMOS or of the PMOS type.

As mentioned before, in another embodiment of the invention, a lowpass filter is defined using a plurality of differential biquad filters all connected in series, and powered by the same power supply.

Figure 4:
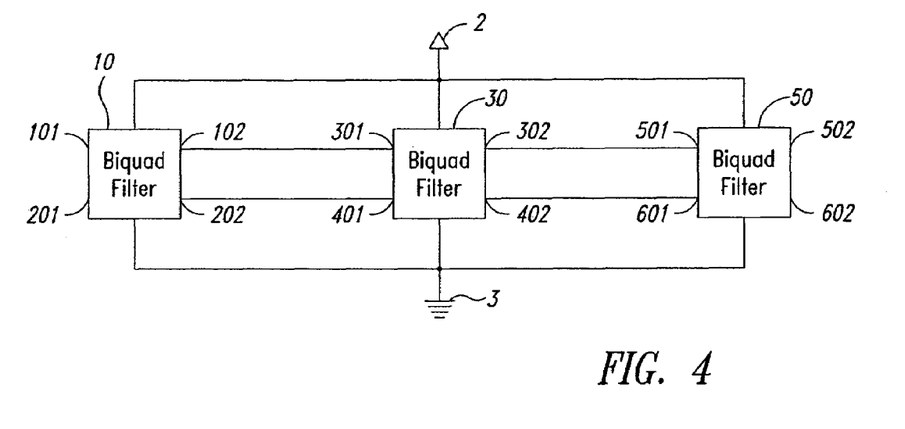
FIG. 4 is a block circuit diagram of an exemplary lowpass filter made of 3 differential biquads according to a second aspect of the present invention.

FIG. 4 shows an example of a multi-stage lowpass filter where 3 biquads as described before are cascaded, hence a $6^{th}$ order filter. The lowpass filter comprises first and second power supply terminals 2, 3, and further comprises a positive input terminal 101 and a negative input terminal 201, a positive output terminal 502 and a negative output terminal 602. The $6^{th}$ order filter also comprises a plurality of elementary differential biquad filters of the type described here above in respect to FIG. 3. In the example of FIG. 4, there are three cascaded such elementary differential biquad filters, and numbered 10, 30 and 50. The differential biquad filters are powered between the first and second power supply terminals 2 and 3.

The plurality of elementary differential biquad filters are linked with each other. Buffers should be employed between each biquad to isolate the output of the previous biquad from the input of the next. This is common practice for biquads with a high input admittance, as is the practice of placing another type of circuit with a similar buffer role before the first and after the last biquad. Consequently, the full 6th order lowpass filter in one embodiment of the invention will employ 3 biquads and 4 buffers. The buffers are used to isolate the poles of each biquad from outside interference.

Through the buffers, the positive and negative output terminals of one elementary differential biquad filter (except for the last one) are connected respectively to the positive and negative input terminals of another one of said differential biquad filters. Permutations can also implemented as the positive output of a biquad could be connected to the negative input of the following biquad (effectively multiplying the transfer function by −1), and the negative output of the second biquad could be connected to the positive input of a third biquad (again multiplying the transfer function by −1), resulting in no change in the total transfer function (−1*−1=1).

In the example of FIG. 4, the buffers are not represented. Differential biquad filter 10 comprises positive and negative input terminals 101 and 201 respectively, and positive and negative output terminals 102 and 202 respectively. Differential biquad filter 30 comprises positive and negative input terminals 301 and 401 respectively, and positive and negative output terminals 302 and 402 respectively. Differential biquad filter 50 comprises positive and negative input terminals 501 and 601 respectively, and positive and negative output terminals 501 and 602 respectively.

In order to connect the three elementary differential biquad filters 10, 30 and 50, output terminals 102 and 202 are linked to the input terminals 301 and 401 respectively, and output terminals 302 and 402 are linked to the input terminals 501 and 601 respectively. In this example, a positive output terminal is linked to a positive input terminal, while a negative output terminal is linked to a negative input terminal.

The positive and negative input terminals of the whole lowpass filter correspond respectively to the positive and negative input terminals of the first of the plurality of elementary differential biquad filters, while the positive and negative output terminals correspond respectively to the positive and negative output terminals of the last of the plurality of differential biquad circuits. As mentioned before permutation can be used while linking the positive and negative terminals together.

A typical example of an application of a lowpass biquad filter according to the invention is presented on FIG. 5. The response of a lowpass filter is plotted (GAIN T) as well as the response of the 3 successive differential filters in series with each other (GAIN1, GAIN2, GAIN3). For each differential filter, the capacitance values have been chosen and equations (5), (6), and (7) have been used to calculate the appropriate conductance values. The component values are given for each differential biquad filter in Table 1 here below. Conductance values are given in mS, the corresponding resistance are given in kΩ between parenthesis. The capacitances are given in fF.

TABLE 1

|  | 1st differential biquad filter | 2nd differential biquad filter | 3rd differential biquad filter |
|---|---|---|---|
| g1 | 0.8 mS (1.25 kΩ) | 1.67 mS (0.6 kΩ) | 1.72 mS (0.58 kΩ) |

TABLE 1-continued

|  | 1st differential biquad filter | 2nd differential biquad filter | 3rd differential biquad filter |
|---|---|---|---|
| g2 | 0.2 mS (5.0 kΩ) | 0.83 mS (1.2 kΩ) | 1.03 mS (0.97 kΩ) |
| C3 | 250 fF | 750 fF | 750 fF |
| C4 | 250 fF | 750 fF | 750 fF |
| C5 | / | 750 fF | 750 fF |

If the transconductance gm of the NPN transistor of FIG. 5 is taken into account, it can be shown that there are parasitic zeros at:

$$Z = \frac{g_2(C_3 + C_4 + 2C_5) \pm \sqrt{4gmg_2C_3C_4 + g_2^2(C_3 + C_4 + 2C_5)^2}}{2C_3C_4} \quad (8)$$

Provided that $4gmg_2C_3C_4 \gg g_2^2(C_3+C_4+2C_5)^2$, equation (8) maybe approximated as a real zero pair appearing at $$Z \approx \pm\sqrt{\frac{gmg_2}{C_3C_4}} = \pm\sqrt{\frac{gm}{g1}}|P|.$$

Thus the transconductance of the NPN transistor should be sufficiently large to ensure that this zero pair does not interfere with the frequency response of the lowpass filter.

With nominal values, the lowpass filter with the parameter values of Table 1 leads to a current consumption of 4.5 mA, and an output noise of −134±0.1 dBc/Hz. Analyses show that the noise performance and the current consumption are dominated by the biquad conductances values. Therefore, as these conductances are increased to meet the noise specifications, the current consumption will increase accordingly.

In the embodiments of the lowpass filter described here before, a limited number of transistors have been configured in a novel way to produce a low noise high Q lowpass filter.

Capacitive arrays can be used to compensate for the variation in the devices over temperature and process. For example, a calibration scheme can be implemented by logic blocks, thanks to a circuit which detects the temperature and process speed and automatically finds the appropriate values for the bits attached to the capacitive arrays. This can be done by having capacitors in series with switches, such that when the switch is on, the architecture "sees" the capacitance, in order to tune the filter.

Buffer and biasing circuits can also be provided with the global architecture of the lowpass filter presented here above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A differential biquad filter, comprising:
first and second power supply terminals;
a positive single ended circuit that includes:
    a first input terminal;
    a first transistor having a control terminal, and first and second main terminals;

a first output terminal corresponding to the control terminal of said first transistor;
first and second conductances connected between said single input terminal and the control terminal of said first transistor and connected to each other at a first node;
a first current source connected between said first power supply terminal and the first main terminal of said first transistor;
a second current source connected between the second main terminal of said first transistor and said second power supply terminal;
a first capacitance connected; and
a second capacitance connected between the first node and said second main terminal of said first transistor;
a negative single ended circuit that includes:
a second input terminal;
a second transistor having a control terminal, and first and second main terminals;
a second output terminal corresponding to the control terminal of said second transistor;
third and fourth conductances connected between said single input terminal and the control terminal of said second transistor and connected to each other at a second node;
a third current source connected between said first power supply terminal and the first main terminal of said second transistor;
a fourth current source connected between the second main terminal of said second transistor and said second power supply terminal;
a third capacitance connected between the control terminal of said second transistor and the second main terminal of the first transistor; and
a fourth capacitance connected between the second node and said second main terminal of said second transistor; said first main terminal of the second transistor being further connected to the first node, wherein the first capacitance is connected between the control terminal of said first transistor and the second main terminal of the second transistor, the second capacitance is connected between the first node and said second main terminal of said first transistor, and said first main terminal of the first transistor being coupled to the second node; and
a third capacitance connected between the second main terminal of the first transistor and the second main terminal of the second transistor.

2. A differential biquad filter according to claim 1, wherein the transistor of the positive single ended circuit and the transistor of the negative single ended circuit are identical bipolar transistors, either of the NPN or of the PNP type.

3. A differential biquad filter according to claim 1, wherein the transistor of the positive single ended circuit and the transistor of the negative single ended circuit are identical MOS transistors, either of the NMOS or of the PMOS type.

4. A lowpass filter comprising:
first and second power supply terminals;
a positive input terminal and a negative input terminal;
a positive output terminal and a negative output terminal;
a plurality of differential biquad filters powered between said first and second power supply terminals and connected with each other between the input and output terminals;
said positive and negative input terminals corresponding to input terminals of a first of said plurality of differential biquad filters, while said positive and negative output terminals corresponding to output terminals of a last of said plurality of differential biquad circuits, each of the differential biquad filters including:
a positive single ended circuit that includes:
a first input terminal;
a first transistor having a control terminal, and first and second main terminals;
a first output terminal corresponding to the control terminal of said first transistor;
first and second conductances connected between said single input terminal and the control terminal of said first transistor and connected to each other at a first node;
a first current source connected between said first power supply terminal and the first main terminal of said first transistor;
a second current source connected between the second main terminal of said first transistor and said second power supply terminal;
a first capacitance connected; and
a second capacitance connected between the first node and said second main terminal of said first transistor;
a negative single ended circuit that includes:
a second input terminal;
a second transistor having a control terminal, and first and second main terminals;
a second output terminal corresponding to the control terminal of said second transistor;
third and fourth conductances connected between said second input terminal and the control terminal of said second transistor and connected to each other at a second node;
a third current source connected between said first power supply terminal and the first main terminal of said second transistor;
a fourth current source connected between the second main terminal of said second transistor and said second power supply terminal;
a third capacitance connected between the control terminal of said second transistor and the second main terminal of the first transistor; and
a fourth capacitance connected between the second node and said second main terminal of said second transistor; said first main terminal of the second transistor being further connected to the first node, wherein the first capacitance is connected between the control terminal of said first transistor and the second main terminal of the second transistor, the second capacitance is connected between the first node and said second main terminal of said first transistor, and said first main terminal of the first transistor being coupled to the second node; and
a third capacitance connected between the second main terminal of the first transistor and the second main terminal of the second transistor.

5. A low pass filter according to claim 4, wherein the transistor of each positive single ended circuit and the transistor of each negative single ended circuit are identical bipolar transistors, either of the NPN or of the PNP type.

6. A low pass filter according to claim 4, wherein the transistor of each positive single ended circuit and the transistor of each negative single ended circuit are identical MOS transistors, either of the NMOS or of the PMOS type.

7. A differential biquad filter, comprising:
first and second power supply terminals;
first and second input terminals;
a first transistor connected between the power supply terminals, the first transistor including a control terminal connected to the first input terminal, a first conduction terminal connected to the second input terminal, and a second conduction terminal;
a second transistor connected between the power supply terminals, the second transistor including a control terminal connected to the second input terminal, a first conduction terminal connected to the first input terminal, and a second conduction terminal;
a first capacitance connected between the second conduction terminals;
a first conductance connected between the first input terminal and the first conduction terminal of the second transistor; and
a second conductance connected between the second input terminal and the first conduction terminal of the first transistor.

8. The filter of claim 7, further comprising:
a third conductance connected between the first conductance and the control terminal of the first transistor; and
a fourth conductance connected between the second conductance and the control terminal of the second transistor.

9. The filter of claim 8, further comprising:
a second capacitance connected between the control terminal of the first transistor and the second conduction terminal of the second transistor; and
a third capacitance connected between the control terminal of the second transistor and the second conduction terminal of the first transistor.

10. The filter of claim 9, further comprising:
a fourth capacitance connected between the second conduction terminal of the first transistor and the first conduction terminal of the second transistor; and
a fifth capacitance connected between the second conduction terminal of the second transistor and the first conduction terminal of the first transistor.

11. The filter of claim 10, further comprising:
a first current source connected between the first power supply terminal and the first conduction terminal of the first transistor;
a second current source connected between the first power supply terminal and the first conduction terminal of the second transistor;
a third current source connected between the second power supply terminal and the second conduction terminal of the first transistor; and
a fourth current source connected between the second power supply terminal and the second conduction terminal of the second transistor.

12. A differential biquad filter, comprising:
first and second power supply terminals;
first and second input terminals;
a first transistor connected between the power supply terminals, the first transistor including a control terminal connected to the first input terminal, a first conduction terminal connected to the second input terminal, and a second conduction terminal;
a second transistor connected between the power supply terminals, the second transistor including a control terminal connected to the second input terminal, a first conduction terminal connected to the first input terminal, and a second conduction terminal;

a first capacitance connected between the second conduction terminals;
a second capacitance connected between the control terminal of the first transistor and the second conduction terminal of the second transistor; and
a third capacitance connected between the control terminal of the second transistor and the second conduction terminal of the first transistor.

13. The filter of claim 12, further comprising:
a fourth capacitance connected between the second conduction terminal of the first transistor and the first conduction terminal of the second transistor; and
a fifth capacitance connected between the second conduction terminal of the second transistor and the first conduction terminal of the first transistor.

14. The filter of claim 13, further comprising:
a first current source connected between the first power supply terminal and the first conduction terminal of the first transistor;
a second current source connected between the first power supply terminal and the first conduction terminal of the second transistor;
a third current source connected between the second power supply terminal and the second conduction terminal of the first transistor; and
a fourth current source connected between the second power supply terminal and the second conduction terminal of the second transistor.

15. The filter of claim 13, further comprising:
a first conductance connected between the second and fourth capacitances; and
a second conductance connected between the third and fifth capacitances.

16. A differential biquad filter, comprising:
first and second power supply terminals;
first and second input terminals;
a first transistor connected between the power supply terminals, the first transistor including a control terminal connected to the first input terminal, a first conduction terminal connected to the second input terminal, and a second conduction terminal;
a second transistor connected between the power supply terminals, the second transistor including a control terminal connected to the second input terminal, a first conduction terminal connected to the first input terminal, and a second conduction terminal;
a first capacitance connected between the second conduction terminals;
a second capacitance connected between the second conduction terminal of the first transistor and the first conduction terminal of the second transistor; and
a third capacitance connected between the second conduction terminal of the second transistor and the first conduction terminal of the first transistor.

17. The filter of claim 16, further comprising:
a first conductance connected between the second capacitance and the control terminal of the first transistor; and
a second conductance connected between the third capacitance and the control terminal of the second transistor.

18. The filter of claim 17, further comprising:
a fourth capacitance connected between a first end of the first capacitance and the control terminal of the second transistor; and
a fifth capacitance connected between a second end of the first capacitance and the control terminal of the first transistor.

19. The filter of claim 16, further comprising:

a first current source connected between the first power supply terminal and the first conduction terminal of the first transistor;

a second current source connected between the first power supply terminal and the first conduction terminal of the second transistor;

a third current source connected between the second power supply terminal and the second conduction terminal of the first transistor; and a fourth current source connected between the second power supply terminal and the second conduction terminal of the second transistor.

* * * * *